United States Patent
Dijkstra et al.

(10) Patent No.: US 8,415,943 B2
(45) Date of Patent: Apr. 9, 2013

(54) PROBE FOR MEASURING AN ELECTRIC FIELD

(75) Inventors: Patrick Walter Josef Dijkstra, Driebruggen (NL); Antonius Josephus Van Peer, Vleuten (NL)

(73) Assignee: Dijkstra Advice, Research & EMC Electronics B.V., Woerden (NL)

( * ) Notice: Subject to any disclaimer, the term of this patent is extended or adjusted under 35 U.S.C. 154(b) by 0 days.

(21) Appl. No.: 12/452,999

(22) PCT Filed: Aug. 4, 2008

(86) PCT No.: PCT/NL2008/050532
§ 371 (c)(1),
(2), (4) Date: Feb. 2, 2010

(87) PCT Pub. No.: WO2009/020388
PCT Pub. Date: Feb. 12, 2009

(65) Prior Publication Data
US 2010/0141241 A1 Jun. 10, 2010

(30) Foreign Application Priority Data

Aug. 3, 2007 (NL) ...................................... 2000793

(51) Int. Cl.
*G01R 1/06* (2006.01)
*G01R 1/04* (2006.01)
(52) U.S. Cl.
USPC .......................................... 324/149; 324/156
(58) Field of Classification Search .................. 324/149, 324/156
See application file for complete search history.

(56) References Cited

U.S. PATENT DOCUMENTS

| 4,277,744 | A | 7/1981 | Audone et al. |
| 4,365,192 | A | 12/1982 | Rankin et al. |
| 5,057,848 | A | 10/1991 | Rankin et al. |
| 5,231,346 | A | 7/1993 | Gassmann |
| D445,050 | S | 7/2001 | Tait |
| 6,565,158 | B2 | 5/2003 | Seimiya |
| 6,593,869 | B1 | 7/2003 | Elliott |

FOREIGN PATENT DOCUMENTS

| EP | 0 501 169 | | 2/1992 |
| EP | 1605270 | A1 * | 12/2005 |
| EP | 1 436 855 | | 7/2007 |
| WO | WO 2006/003303 | | 1/2006 |

OTHER PUBLICATIONS

Partial English Translation of EP1605270A1, Dec. 2005.*
"Low Cost Sensors for Pulsed Electromagnetic Field Measurements", R. De Leo et al., IEEE, pp. 819-822, May 1996.

(Continued)

*Primary Examiner* — Bot Ledynh
(74) *Attorney, Agent, or Firm* — Harness, Dickey & Pierce, P.L.C.

(57) ABSTRACT

In one embodiment of the present invention, a probe for measuring an electrical field is disclosed, including at least one antenna, a detection circuit for each antenna, which detection circuit is connected to the corresponding antenna for detecting an RF signal, and a housing in which is received a processing circuit for processing a detected signal, wherein the housing is conductive and includes at least partially a substantially spherical surface for the purpose of forming a ground plane for the at least one antenna, wherein the detection circuit is arranged outside the housing and is coupled to the processing circuit via a feedthrough capacitor with a feedthrough terminal and a shield, wherein the feedthrough terminal connects the detection circuit conductively to the processing circuit and the shield is connected conductively to the conductive surface of the housing.

14 Claims, 4 Drawing Sheets

OTHER PUBLICATIONS

"An Isotropic Electric-Field Probe with Tapered Resistive Dipoles for Broad-Band Use, 100 kHz to 18GHz", Motohisha Kanda et al., IEEE Transactions on Microwave Theory and Techniques, vol. MTT-35, No. 2, pp. 124-130, Feb. 1987.

"New Sensors for Measuring Very Short Electromagnetic Pulses", Hao-Ming Shen et al., IEE Transactions on Antennas and Propogation, vol. 38, No. 6, pp. 838-846, Jun. 1990.

* cited by examiner

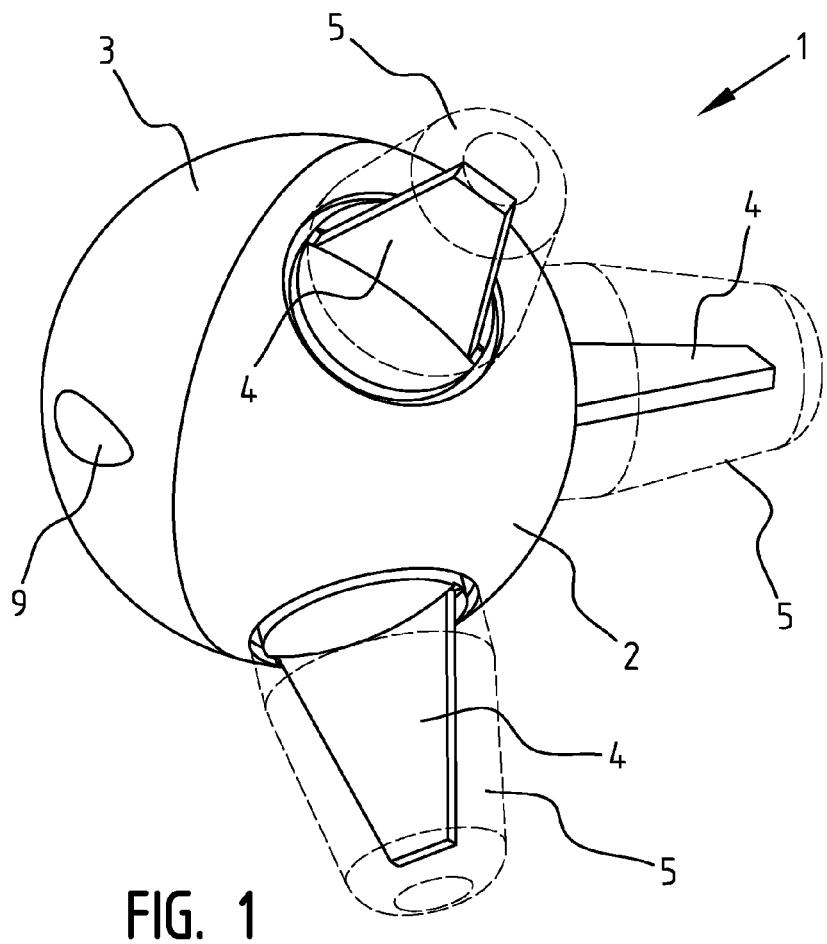
FIG. 1
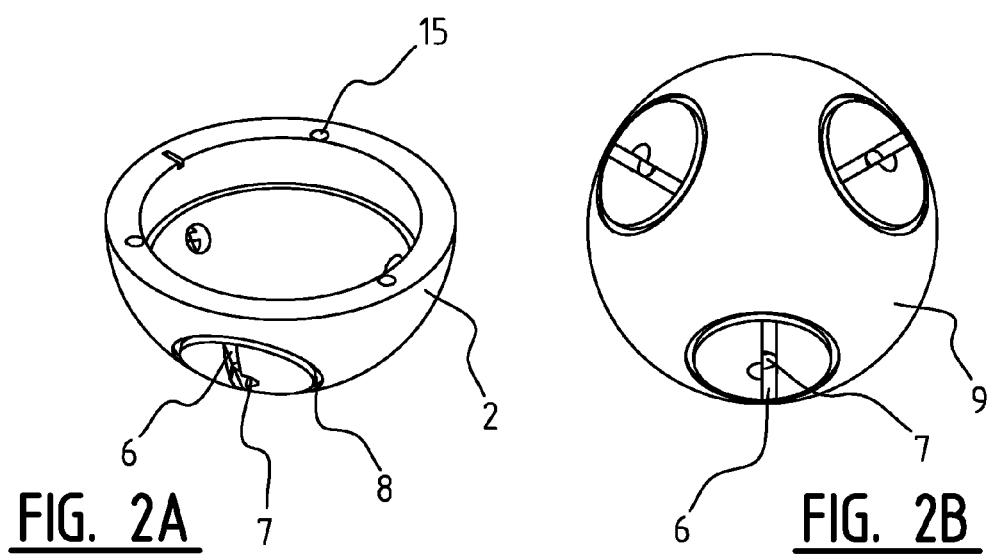
FIG. 2A
FIG. 2B

PROBE FOR MEASURING AN ELECTRIC FIELD

FIELD

The present invention relates to a probe or sensor for measuring an electrical field, comprising at least one antenna; a detection circuit for each antenna, which detection circuit is connected to the corresponding antenna for detecting an RF signal; and a housing in which is received a processing circuit for processing a detected signal. The invention further relates to a monopole antenna which can be used in such a probe.

BACKGROUND

Such field probes are typically used to measure RF fields for all manner of applications, such as measuring the electrical field strength during testing of radiation immunity, calibration of the electrical field in test arrangements, determining the homogeneity of the electrical field in a test installation or measuring the electrical field strength in order to determine whether the field levels lie below a value acceptable for persons.

The known field probes typically use a number of antenna elements and a circuit for converting the RF signal into a DC current with an amplitude which is a function of the amplitude of the RF signal. It is desirable that such probes operate properly, and in particular are isotropic in a wide frequency and amplitude range.

Such a probe is for instance described in U.S. Pat. No. 5,057,848. The probe described therein has three antenna sub-systems which are oriented along respectively an X, Y and Z axis. The antenna elements are connected to a detection/filter circuit, from where the detected signals are transmitted to a processing circuit connected to a power supply and communications circuit, from where optical data signals are sent via an optical fibre for further processing, for instance on a PC. Each antenna sub-system comprises a monopole 60 and a disk antenna 64. The monopole antenna is here connected to a HF detection circuit via a "splice or crimp 94-conductive portion 96-socket 98" structure. This HF detection circuit transmits the detected signals to a processing circuit which is arranged together with the power supply circuit on PCBs 396, 398 in the housing—see FIG. 12. Such a probe has the drawback that there is not a good separation between detection circuit on the one hand and processing circuit on the other, and that the detection diode is arranged in the housing. The probe will hereby be inaccurate in measurements of high-frequency weak signals.

Probes are also known which make use of dipole antenna elements with resistive parts, wherein the detection circuit is provided in the centre or on the side of the dipole antennas. U.S. Pat. No. 6,593,869 thus describes a probe with X, Y and Z dipole antennas, wherein each dipole comprises two twisted branches with discrete resistive elements and the diodes are arranged in the centre of the two branches. The article by Motohisa Kanda et al with the title "An Isotropic Electric-Field Probe with Tapered Resistive Dipoles for Broad-Band Use, 100 kHz to 18 GHz", IEEE, Transactions on Microwave Theory and techniques, vol. MTT-35, no. 2, February 1987, further describes a probe with dipole antenna elements with tapered resistive elements. The most significant drawback of such antenna elements is that the field probe provides a non-isotropic response because of the connecting wires with high impedance which are necessary between the antenna elements and the processing circuit, wherein the processing circuit must be mounted away from the centre.

SUMMARY

The present invention has for its object is to provide a field probe of the type stated in the preamble, wherein an isotropic response can be obtained for a wide frequency range using antenna elements which are short relative to the wavelength of the maximum frequency to be measured.

For this purpose the probe according to the invention is distinguished in that the housing is conductive and has at least partially a preferably substantially spherical surface for the purpose of forming a ground plane for the at least one antenna, wherein the detection circuit is arranged outside the housing and is coupled to the processing circuit via a feedthrough capacitor with a feedthrough terminal and a shield, wherein the feedthrough terminal connects the detection circuit conductively to the processing circuit and the shield is connected conductively to the conductive surface of the housing.

In this manner the housing forms a Faraday cage and the processing circuit is fully shielded from external RF signals, whereby the DC measuring circuits will not be influenced. This is because only the DC signal coming from the detection circuit is carried into the housing via the feedthrough capacitor. In this way very weak high-frequency signals can also be measured accurately, this being a prerequisite for being able to operate with very short antenna elements. These short antenna elements are desirable, on the one hand because the total measuring volume of the probe is hereby reduced, and on the other because the maximum operating frequency can hereby be increased.

According to an advantageous aspect of the invention, the at least one antenna is a monopole antenna.

According to an advantageous aspect of the invention, the antenna is formed by a resistive layer arranged on a plate.

According to an advantageous aspect of the invention, the resistive layer tapers.

According to an advantageous aspect of the invention, the length of the resistive layer is at least five times greater, and preferably at least ten times greater than the maximum width of the tapering resistive layer.

According to an advantageous aspect of the invention, the length of the antennas lies between 0.5 and 15 mm, preferably between 0.5 and 4 mm.

According to an advantageous aspect of the invention, the detection circuit is mounted on the plate of the antenna.

According to an advantageous aspect of the invention, the detection circuit comprises a diode mounted between two central bond pads provided centrally below the resistive layer one below the other at the base of the plate, wherein the lower central bond pad is connected to the processing circuit through the housing via the feedthrough terminal of the feedthrough capacitor.

According to an advantageous aspect of the invention, the base is provided with at least one conductive strip for the purpose of forming the ground of the detection circuit, and that the conductive surface of the housing is provided with a channel for arranging the base of the plate therein, this such that the plate lies substantially perpendicularly of the conductive surface of the housing and that the at least one conductive strip is connected conductively to the housing.

According to an advantageous aspect of the invention, the at least one conductive strip on the base of the plate comprises two bond pads preferably arranged symmetrically relative to the antenna.

According to an advantageous aspect of the invention, the detection circuit comprises a low-barrier Schottky diode.

According to an advantageous aspect of the invention, the dimensions of the housing are at least twice as large as the length of the antenna.

According to an advantageous aspect of the invention, the resistance of the layer lies between 0.5 and 10 Ω/sq, preferably between 1 and 4 Ω/sq.

According to an advantageous aspect of the invention, three antennas are arranged on the conductive housing in accordance with three axes oriented perpendicularly of each other.

According to another aspect of the invention, the probe of the type stated in the preamble is distinguished in that each antenna and detection circuit are provided on a plate with a base on which at least one conductive strip is arranged for the purpose of forming a ground for the detection circuit, wherein the housing is conductive and the plate is arranged perpendicularly of the conductive housing, this such that the conductive strip makes contact with the housing. Note that this aspect of the invention can also be combined with one or more measures of the above disclosed preferred aspects.

A very compact probe is obtained by such a mounting of the antenna and detection circuit on a plate outside the housing. Particularly when three probes are provided, this has the advantage that the distance between the outer ends of the antennas is reduced to a minimum.

According to yet another aspect of the invention, the housing consists of at least two parts, wherein a first part has at least partially a substantially spherical conductive outer wall for the purpose of forming a ground plane for the at least one antenna, and the second part is provided with at least one opening for an optical fibre, wherein space is provided in the housing for mounting therein of at least one PCB on which among other parts the processing circuit is mounted, this at least one PCB preferably being disc-shaped. Note that this aspect of the invention can likewise be combined with one or more measures of the above disclosed preferred aspects.

By operating with a two-part conductive housing, with at least a first part on which the antennas are provided being spherical, a very compact antenna can be constructed, wherein the dimensions of the housing plus antenna remain limited such that a good homogeneity is obtained when for instance three antennas are used in an X, Y and Z direction.

DRAWINGS

The accompanying drawings illustrate non-limitative preferred exemplary embodiment of the present invention. The above stated and other advantages, features and objectives of the invention will become more apparent and the invention will be better understood from the following detailed description with reference to the accompanying drawings, in which:

FIG. 1 is a perspective view of an embodiment of a probe according to the invention;

FIGS. 2A and B show respectively a perspective and front view of one half of the housing of the probe of FIG. 1;

FIGS. 3A, B and C show respectively a perspective view, a cross-section and a bottom view of the other half of the housing of the probe of FIG. 1;

FIGS. 4A and B show respectively a perspective view and a cross-section of the protective caps of the probe of FIG. 1;

FIG. 5 is a top view of a substrate with a monopole antenna according to an embodiment of the invention;

FIGS. 6A and B are schematic views of the PCBs of the probe of FIG. 1;

DETAILED DESCRIPTION OF BEST MODE FOR CARRYING OUT THE INVENTION

Figure 3A:
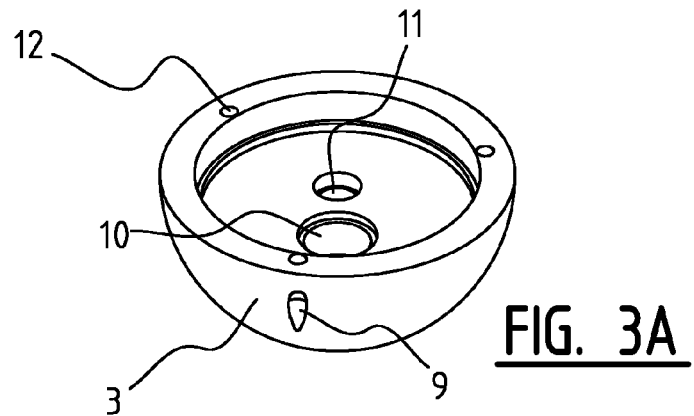
Figure 3B:
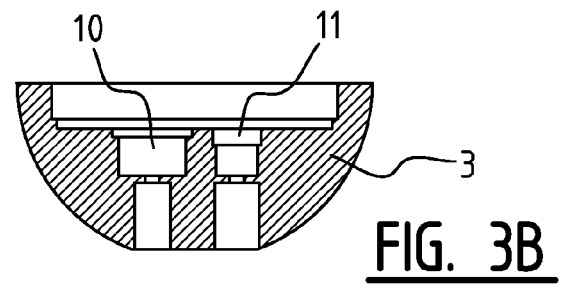
Figure 3C:
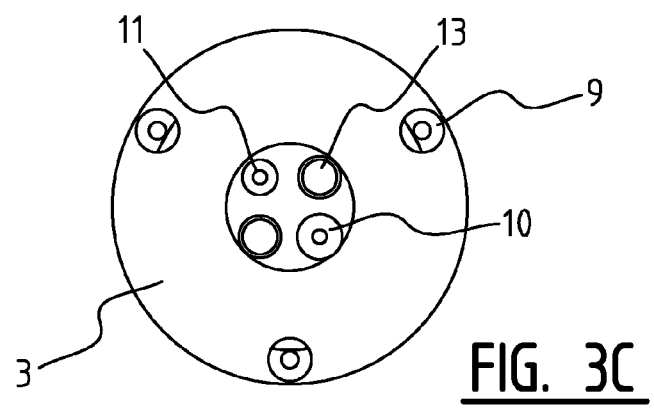
Figure 4A:
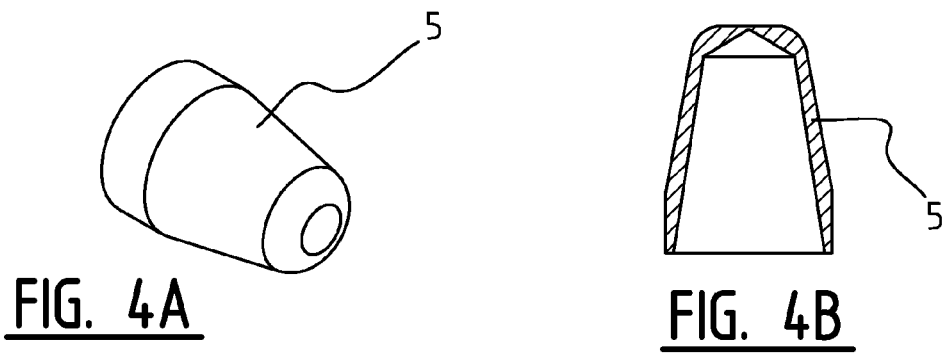
Figure 4B:
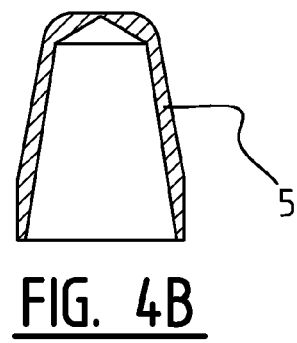

In the embodiment illustrated in FIG. 1 the housing is constructed of two substantially spherical parts 2, 3 which are manufactured from a conductive material, typically a metal, and preferably optionally gilded brass. Three monopole antennas 4 are arranged on a first part 2 of the housing in an X, Y and Z direction of an orthogonal coordinate system. Each antenna is enclosed by a protective cap 5 typically manufactured from a material with a low dielectric constant and a low tan, such as HMP (high-molecular polyethylene).

Note that it is particularly important that the outer surface around antennas 4 is substantially spherical and that the other part of the housing can also take a different form, wherein the dimensions of the antenna must preferably be small relative to those of the ground plane formed by the outer surface of the housing around each antenna.

FIGS. 2A and B show that first part 2 is provided with three channels 6 in which a substrate with monopole 4 can be arranged in each case. In the centre of each channel 6 a continuous hole 7 is provided for a feedthrough capacitor, as will be further explained. A circular channel 8 is further provided around each antenna for mounting of protective cap 5.

Figure 5:
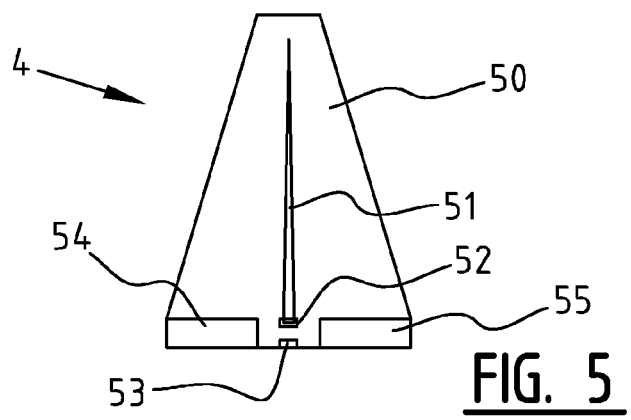
Figure 7:
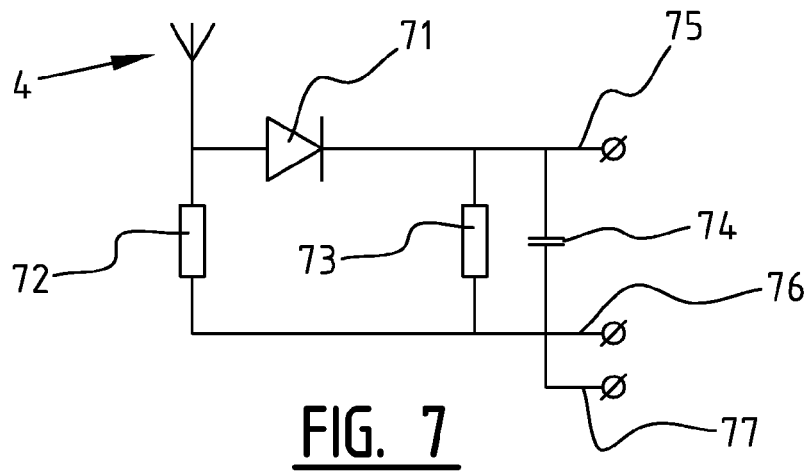
FIG. 7 shows a diagram of an embodiment of a detection circuit.

As illustrated in FIG. 5, monopole antenna 4 consists of a ceramic substrate 50, manufactured for instance from $Al_2O_3$, on which is arranged a tapering layer 51 of a resistive material, such as for instance tantalum nitride. Further provided are four bond pads 52-55 for bonding the components of the detection/filter circuit of FIG. 7. The skilled person will appreciate that the detection circuit can also be designed and laid out differently, and that more or fewer bond pads can also be provided. The bond pads 52, 53 arranged centrally under tapering layer 51 are intended for connecting a detection diode 71 (see FIG. 7) of the detection circuit. A first resistor 72 of for instance 100 kΩ is further arranged between bond pad 52 and bond pad 54, and a second resistor 73 of for instance 1 MΩ between bond pad 53 and bond pad 54. The detection/filter circuit further comprises a capacitor 74 of for instance 10 pF, which is coupled between bond pad 53 and bond pad 55. The capacitor is preferably a single-layer capacitor. SMD (Surface Mount Device) components (for instance of the 0402 type) with good HF properties, i.e. a capacitor with a low induction, are preferably applied for these components 72-74. The detector must preferably be suitable for frequencies to a minimum of 6 GHz, and more preferably for higher frequencies up to 40 GHz.

In the shown embodiment of the probe the ceramic substrate 50 is placed with its base in channel 6, wherein bond pads 54 and 55 are connected to the conductive housing using a conductive material, such as for instance a silver adhesive, wherein the conductive housing is thus simultaneously ground plane for the antenna elements. The skilled person will appreciate that other techniques, such as soldering, can also be used instead of adhesion for the purpose of mounting the substrate perpendicularly of the ground plane.

Bond pad 53 is connected to the electronics in the housing via the feedthrough terminal of a feedthrough capacitor, wherein the shield (shielding plate) of the feedthrough capacitor is connected to the housing, for instance by means of soldering. The feedthrough capacitor preferably has small dimensions and good HF properties, and can for instance have a value of 1 nF. A suitable feedthrough capacitor is for instance the 2463-002-X5U0-152P LF type from the manufacturer Tusonix.

Owing to such a mounting of the monopole elements on the housing the parasitic pick-up of fields behind the detector circuit before the DC signal is fed into the Faraday cage is limited to a minimum, this enhancing the accuracy of the probe. Very weak signals can thus also be detected. Furthermore, the symmetrical construction results in a probe with good isotropic properties.

The tapered transmission line of the monopole acts as an attenuator which prevents resonance occurring at λ/4 and is designed for a good and uniform impedance adjustment between the field impedance and the detector element. Maximum power transmission will take place when the resistance of the resistive layer is equal to the far-field impedance in the free space, i.e. 120π Ohm (=377 Ohm). The maximum detected frequency will further be higher at a lower resistance (wherein the parasitic capacity of the detection diode will also be a factor), although resonance must of course be avoided, i.e. the antenna must be shorter than the wavelength of the highest frequency to be detected. The dimensions of resistive layer 51, the thickness of this layer and the resistive material used, among others, can thus be optimized in accordance with the desired properties of the probe.

The length of resistive layer 51 preferably lies between 0.5 mm and 15 mm, and the width is preferably at least five times smaller than the length, and more preferably ten times smaller. By making the width much smaller than the length a good directional sensitivity is obtained, whereby the isotropy of the sensor improves. The resistance of the resistive material preferably lies between 0.5 and 10 Ω/sq, and more preferably between 1 and 5 Ω/sq.

The length of the resistive layer is further preferably at least twice as small as the diameter of the housing. This is because the shorter the antenna is relative to the dimensions of the ground plane, the better the frequency response. The diameter of the housing typically lies between 5 and 30 mm, and preferably between 10 and 25 mm.

Figure 8:
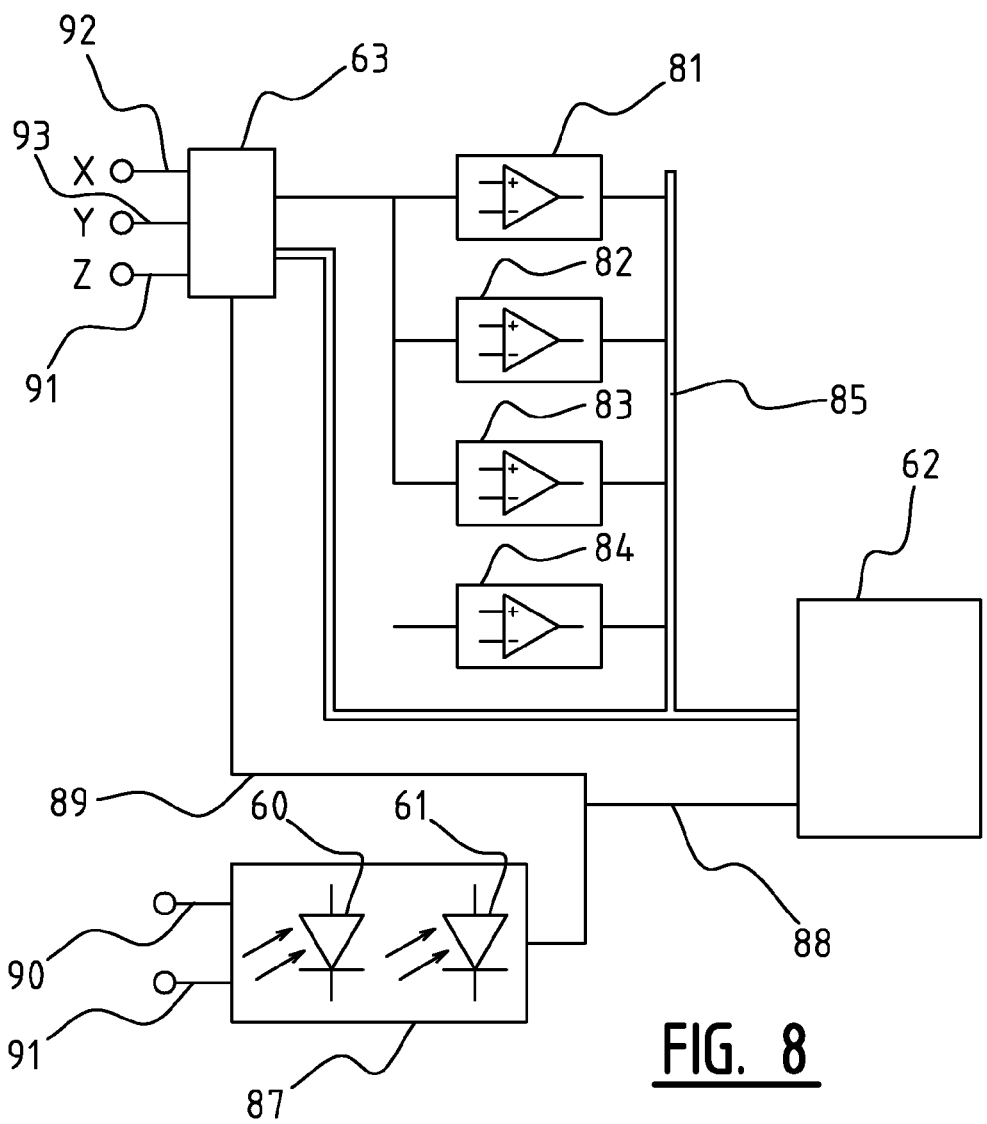
FIG. 8 shows a block diagram of the electronics mounted in the housing.

FIG. 8 shows a block diagram of a possible embodiment of the electronics accommodated in the housing for the purpose of processing the detected signals. The X, Y and Z signals received by the respective antenna elements are measured sequentially and transmitted via a switch 63 to three amplifiers 81-83 connected in parallel, such that different ranges are measured in parallel. Amplifier 84 is intended for the purpose of carrying out a temperature compensation. Mounted in the housing is a diode (not shown) which is identical to detection diode 71. This diode is thus situated in the Faraday cage and is not influenced by external signals, although it will have substantially the same temperature as detection diode 71 since both the housing (of metal) and the substrate and the connecting materials have good thermally conducting properties. Measurement errors resulting from temperature increases can in this way be avoided. The output signals from amplifiers 81-84 are transmitted to a bus 85 which transfers these signals to a microcontroller 62 for further processing. A power supply/communication block 87 is further provided, which on one hand provides the power supply to the different components via among others lines 88 and 89 (the power supply lines are not shown for all components), and which on the other hand receives measurement data from the microcontroller (not shown). These measurement data are converted via a LED 61 into optical signals which are carried out of the housing via a fibre. Power supply block 87 further comprises an optical-electrical converter 60 for converting into an electrical power an optical power carried into the housing via a fibre.

Figure 6A:
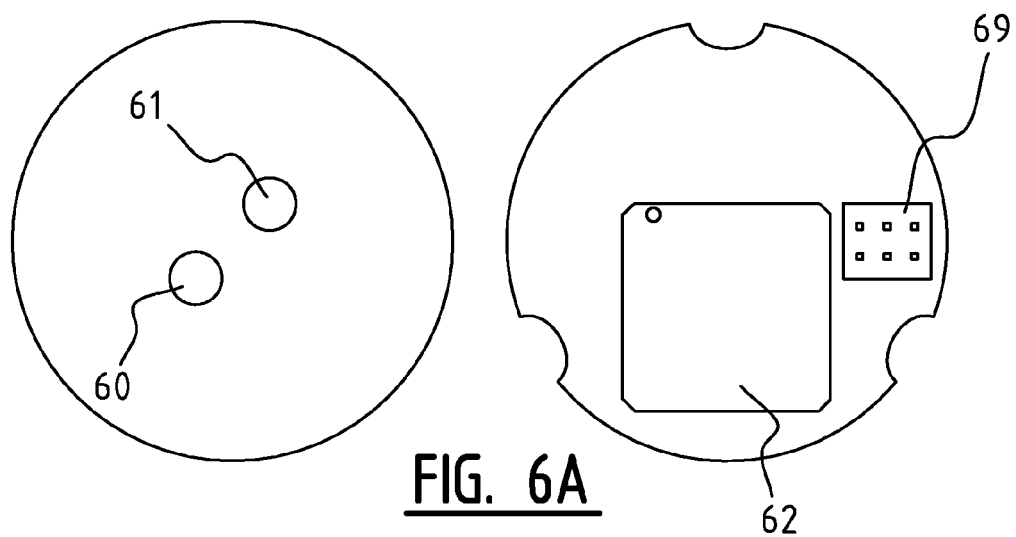

As shown in FIGS. 3A, B and C, two through-holes 10, 11 are provided in the second hemispherical part 3 of the housing for passage in each case of an optical fibre, respectively for transmitting the measurement data via a LED 61 and for power supply to an optical-electrical converter 60 (see FIG. 6A and FIG. 8). The optical-electrical converter and the transmitter LED, including the required optical alignment thereof, are integrated into the electrically conductive housing such that the fibre optic cables are fed into the housing via a waveguide feedthrough. The inlet of these optical cables is hereby completely closed to high frequencies, and a very compact and robust probe is realized. The outer wall of part 3 is further provided with mounting holes 13 for mounting on for instance a stand. Part 3 is further provided with three bores 12 for screws, which can co-act with corresponding bores 15 in part 2 for the purpose of mounting the two halves of the housing against each other. Bores 12 are embodied on the outer wall of part 3 such that the screws can be arranged countersunk.

In part 3 a first PCB as shown in FIG. 6A is mounted with its rear wall, on which diodes 60, 61 are arranged, against the flat inner wall 14 of part 3 of the housing, this such that the diodes are located in front of holes 60, 61. A microcontroller 62 and a number of discrete elements (not shown) connected thereto are mounted, among other parts, on the front side of this first PCB. Components 68, 69 (FIGS. 6A and 6B) are intended for the electrical connection between the first and the second PCB.

Figure 6B:
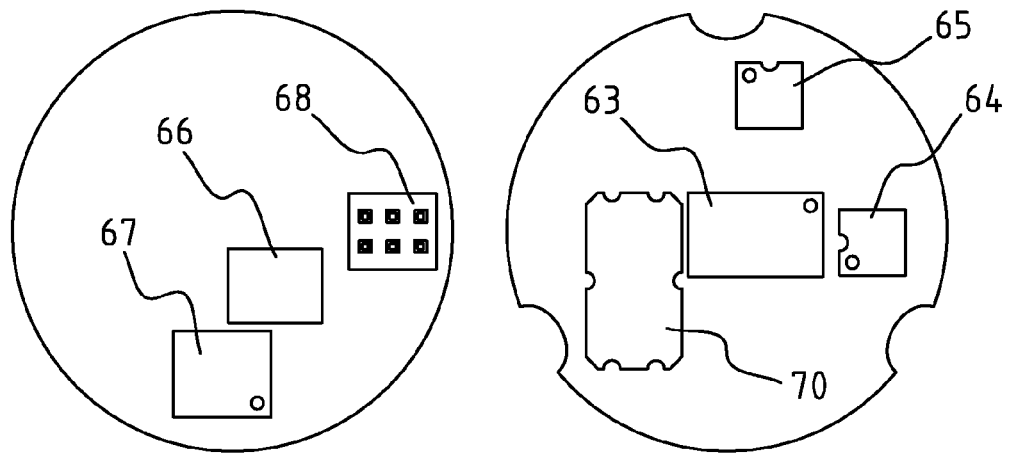

A second PCB as shown in FIG. 6B is mounted at a distance from the first PCB. Typically arranged on the rear side of the second PCB, which is directed toward the first PCB, are a number of discrete elements (not shown) and components 66, 67 which are required for power supply and communication circuit 87 (see FIG. 8). Typically arranged on the front side of the second PCB are switch 63 and amplifiers 81-83, of which a number of components 64-65 are shown. A crystal 70 is further provided as clock oscillator for microcontroller 62.

The skilled person will appreciate that the invention is not limited to the above described exemplary embodiments and that many modifications and variants are possible without departing from the scope of the invention, wherein the scope of protection is defined solely by the appended claims.

The invention claimed is:

1. Probe for measuring an electrical field, comprising:
   at least one antenna;
   a detection circuit for each at least one antenna, each detection circuit being connected to a corresponding at least one antenna for detecting an RF signal; and
   a housing in which a processing circuit for processing a detected signal is located, the housing being conductive and including at least partially a substantially spherical surface for forming a ground plane for the at least one antenna, the detection circuit being arranged outside the housing and being coupled to the processing circuit via a feedthrough capacitor with a feedthrough terminal and a shield, the feedthrough terminal connecting the detection circuit conductively to the processing circuit and the shield being connected conductively to the conductive surface of the housing.

2. Probe as claimed in claim 1, wherein each antenna of the at least one antenna is a monopole antenna.

3. Probe as claimed in claim 1, wherein each antenna of the at least one antenna is formed by a resistive layer arranged on a plate.

4. Probe as claimed in claim 3, wherein the resistive layer is a tapered layer including a first end connected to the detection circuit and a second end, said tapered layer narrowing from said first end to said second end of the antenna.

5. Probe as claimed in claim 4, wherein the resistive layer has a length and a maximum width, wherein the length is measured in the lengthwise direction of the antenna from the first end to the second end, and wherein the maximum width is measured at the first end;
   wherein the length of the resistive layer is at least five times greater than the maximum width of the tapered resistive layer.

6. Probe as claimed in claim 5, wherein the length of the antennas lies between 0.5 and 15 mm.

7. Probe as claimed in claim 3, wherein the detection circuit is mounted on the plate of the antenna.

8. Probe as claimed in claim 3, wherein the antenna plate has a base, wherein the detection circuit comprises a diode mounted between two central bond pads provided centrally below the resistive layer, one below the other at the base of the plate, wherein the lower central bond pad is connected to the processing circuit through the housing via the feedthrough terminal of the feedthrough capacitor.

9. Probe as claimed in claim 3, wherein the antenna plate has a base, wherein the base is provided with at least one conductive strip for forming a ground of the detection circuit, and wherein the conductive surface of the housing is provided with a channel for arranging the base of the plate therein, such that the plate lies substantially perpendicularly of the conductive surface of the housing and wherein the at least one conductive strip is connected conductively to the housing.

10. Probe as claimed in claim 9, wherein the at least one conductive strip on the base of the plate comprises two bond pads.

11. Probe as claimed in claim 1, wherein the detection circuit comprises a low-barrier Schottky diode.

12. Probe as claimed in claim 1, wherein the dimensions of the housing are at least twice as large as the length of the antenna.

13. Probe as claimed in claim 1, wherein the antenna consists substantially of a resistive layer, wherein the resistance of the layer lies between 0.5 and 10 $\Omega$/sq.

14. Probe as claimed in claim 1, wherein three antennas are arranged on the conductive housing in accordance with three axes oriented perpendicularly of each other.

\* \* \* \* \*